United States Patent [19]
Tezuka et al.

[11] Patent Number: 5,170,207
[45] Date of Patent: Dec. 8, 1992

[54] PROJECTION LENS SYSTEM

[75] Inventors: Yoshiko Tezuka, Saitama; Keiichi Kuba, Hachioji, both of Japan

[73] Assignee: Olympus Optical Co., Ltd., Tokyo, Japan

[21] Appl. No.: 806,126

[22] Filed: Dec. 12, 1991

[30] Foreign Application Priority Data

Dec. 12, 1990 [JP] Japan .................. 2-410271

[51] Int. Cl.$^5$ .................................. G03B 27/42
[52] U.S. Cl. ........................ 355/53; 355/67; 359/742
[58] Field of Search ............. 355/67, 53; 359/742

[56] References Cited
U.S. PATENT DOCUMENTS 4,891,663  1/1990  Hirose ............. 355/53
4,936,665  6/1990  Whitney .

OTHER PUBLICATIONS

W. C. Sweatt, "Mathematical Equivalence Between a Holographic Optical Element and an Ultra-High Index Lens" J. Opt. Soc. Am., Mar. 1979, pp. 486–487.

Primary Examiner—Monroe H. Hayes
Attorney, Agent, or Firm—Cushman, Darby & Cushman

[57] ABSTRACT

The present invention relates to a projection lens system well-fit for baking integrated circuit patterns onto silicon wafers using a light source having wavelengths ranging from an ultraviolet wavelength zone to a vacuum ultraviolet wavelength zone. This projection lens system is characterized by comprising a plurality of lens elements including a Fresnel lens element having negative dispersion characteristics, said Fresnel lens being located at a position lying somewhere in said projection lens system with the exception of the pupil thereof and satisfying the following condition:

$$2h_{MAX}/3 \leq h.$$

Here $h_{MAX}$ is the maximum height of a marginal ray in said projection lens system, and $h$ is the height of a marginal ray at the position of said Fresnel lens.

13 Claims, 9 Drawing Sheets

PROJECTION LENS SYSTEM

BACKGROUND OF THE INVENTION

This invention relates to a projection lens system used for photolithographic systems designed to project fine circuit patterns such as ICs and LSIs onto semiconductor substrates and, more particularly, to a projecting lens system suitable for exposing integrated circuit patterns onto silicon wafers using light sources having wavelengths between a about 300-150 nm range of ultraviolet rays emanating from excimer laser in particular and a wavelength range of vacuum ultraviolet rays.

So far, step-and-repeat reduction photolithographic exposure systems (now often called STEPPER for short) have been used for exposing integrated circuit patterns such as ICs and LSIs onto silicon wafers, and projection lens systems used for such systems have increasingly been required to have a very high resolving power (resolution) so as to keep pace with the high integration density of integrated circuits now in great demand. In general, the shorter the wavelength of the light used, the better the resolving power of the image projected through projection lens systems. Hence, the wavelength of the light used to expose integrated circuit patterns now becomes shorter and shorter. The wavelengths of light sources used with the STEPPER systems are usually g-line (436 nm) or i-line (365 nm). But in so far as the light having these wavelengths is used, much difficulty would be involved in achieving a high resolving power of the order of about 0.3 μm that is required to fabricate 64 MDRAMs. Thus, excimer lasers KrF (248 nm) and ArF (193 nm) are now being attracted as the light sources of the next generation having shorter wavelengths.

Excimer laser light has a very short wavelength; this implies that an ordinary type of glass can never be used as the material for projection lens systems, because it is insufficient in terms of transmission. In view of transmission, quartz (SiO$_2$) or fluorite (CaF$_2$) may be used, but practical lens material is still limited to quartz, because fluorite involves the problem that it is soft and so difficult to process. For this reason, projection lens systems for step-and-repeat reduction photolithographic exposure systems using excimer lasers as the light sources are still made up of quartz only or a single vitreous material alone, rendering correction of chromatic aberration difficult. In order to obtain the desired resolving power, it is therefore required to narrow the wavelength bandwidth of light emitted by a laser light source to such a degree that no correction of chromatic aberration is needed.

As its wavelength bandwidth becomes narrow, however, the excimer laser is more likely to decrease in output in theory and so is more difficult to excite. In the case of step-and-repeat reduction photolithographic exposure systems, reductions in the outputs of light sources would account for reductions in their throughputs; that is, when the excimer laser is used, making its wavelength bandwidth narrow should be avoided, if circumstances allow, because it is incompatible with the chromatic aberration problem.

SUMMARY OF THE INVENTION

In view of the above problems, this invention seeks to provide a projection lens system for step-and-repeat reduction photolithographic exposure systems, which can well correct chromatic aberrations even when the class of vitreous material usable as lenses is limited.

The projection lens system according to this invention is made up of a plurality of lens elements, at least one of which is a Fresnel lens element having negative dispersion characteristics. The Fresnel lens element is located at a position lying somewhere in the projection lens system with the exception of the pupil thereof and satisfying the following condition:

$$2h_{MAX}/3 \leq h.$$

Here $h_{MAX}$ is the maximum height of a marginal ray in the projection lens system and h is the height of a marginal ray at the position of the Fresnel lens.

According to this invention, all the lens elements but the Fresnel lens element may be made of a single vitreous material. Also, this projection lens system may include two sets of lens component pairs, each having oppositely located concave surfaces and be designed to meet the following condition:

$$h_{MIN}/h_{MAX} < \tfrac{1}{2}.$$

Here $h_{MAX}$ and $h_{MIN}$ are the maximum and minimum values of the height of a marginal ray in the projection lens system.

This invention will now be explained at great length. For a better understanding of this invention, the negative dispersion characteristics of the Fresnel lens element will first be explained.

FIG. 1 is a sectional view of the Fresnel lens element used in this invention, including the optical axis. A Fresnel lens 1 is formed by providing on a substrate a concentrical array of grooves blazed (or inclined with respect to the plane of the substrate). Among means for designing such a Fresnel lens by existing design systems, as in the case of refracting systems, there is an ultrahigh-index technique known from an article by W. C. Sweatt, *J. Opt. Soc. Am.*, Vol. 169, No. 3, March 1979.

In order to explain the conception of this technique, the propagation of light through the section of an ordinary refracting lens inclusive of the optical axis in the direction shown by an arrow is illustrated in FIG. 2. Assume that the angle of incidence of light 3 on a lens 2 is represented by $\theta_1$, the angle of exit by $\theta_2$, coordinate in the optical direction by t and coordinate in the direction along the lens substrate by s. Then, the above article indicates that if the refractive index, n, and thickness, t, of the lens are indefinitely large and an infinitesimally small O, respectively, then the ray tracing formula is $$(n-1)(dt/ds) = \sin\theta_1 - \sin\theta_2. \tag{1}$$

On the other hand, the diffraction formula by the Fresnel lens is given as follows:

$$m\lambda/p = \sin\theta_1 - \sin\theta_2. \tag{2}$$

Here m is the order of diffraction, λ is the wavelength and p is the grating pitch. From Equations (1) and (2), we can now obtain the relation $$m\lambda/p = (n-1)(dt/ds). \tag{3}$$

In other words, a Fresnel lens is equivalent in action to an ordinary refracting lens assumed to have an indefinitely large refractive index, n, and a zero thickness, t.

Then, the pitch, p, of this Fresnel lens can be found from (dt/ds) representing the surface shape of the refracting lens based on Equation (3).

From $(\partial n/\partial \lambda)(dt/ds)=m/p$ obtained by partial differentiation of Equation (3), we can now derive $$\partial n/\partial \lambda = (n-1)/\lambda. \tag{4}$$

Here it is assumed that $\partial n/\partial \lambda$ represents the partial differential. From this equation, we can now find the refractive indices $n_1$, $n_2$ and $n_3$ of a thin lens with respect to three wavelengths $\lambda_1$, $\lambda_2$ and $\lambda_3$ (here assumed that $\lambda_1 > \lambda_2 > \lambda_3$) to be $$\begin{aligned} n_3 &= n_2 + (n/\lambda)(\lambda_3 - \lambda_2), \\ &= n_2 + (\lambda_3 - \lambda_2)(n_2 - 1)/\lambda_2, \\ n_1 &= n_2 + (\lambda_1 - \lambda_2)(n_2 - 1)/\lambda_2. \end{aligned}$$

Using the wavelength $\lambda_2$ as the reference and following the refractive indices obtained just above, we can now find the Abbe's number $\nu_2$ with respect to these three wavelengths to be $$\begin{aligned} \nu_2 &= (n_2 - 1)/(n_3 - n_1). \\ &= \lambda_2/(\lambda_3 - \lambda_1). \end{aligned}$$

Since $\lambda_1 > \lambda_2 > \lambda_3$, the Abbe's number of this Fresnel lens takes a negative value and, hence, would have the so-called negative dispersion characteristics. In this invention, the projection lens system made of a single vitreous material is corrected for chromatic aberration, making use of such negative dispersion characteristics.

Generally speaking, in order to correct the chromatic aberration of a certain lens system, it is required to accommodate the following condition to a thin lens approximation:

$$\Sigma h_i^2/f_i \nu_i = 0.$$

In an image-formation system made of a single vitreous material, however, no complete correction of chromatic aberration is achievable, since $\Sigma h_i^2/f_i \nu_i = (1/\nu)\Sigma h_i^2/f_i > 0$. Here $h_i$ is the heights of marginal rays in the respective lenses, $f_i$ is the focal lengths of the respective lenses and $\nu_i$ is the Abbe's numbers of the respective lenses. If a Fresnel lens having a suitable positive value for the focal length is used, however, then it is possible to meet the achromatic condition, because its Abbe's number takes a negative value. In other words, if h, f and $\nu_0$ are the height of a marginal ray at the Fresnel lens location, the focal length of the Fresnel lens and the Abbe's number, respectively, then the terms resulting from the ordinary lens can cancel out to yield $$\Sigma h_i^2/f_i \nu_i + \Sigma h^2/f\nu_0 > 0.$$

Now suppose that the minimum pitch of a Fresnel lens remains constant, then the focal length, f, of the Fresnel lens is given by $f \approx ky$ (k = a constant and y = an effective radius); that is, the achromatic quantity by the Fresnel lens is given by $$\begin{aligned} h^2/f\nu_0 &\approx h^2/(k\nu_0 y) \\ &= k'h^2/y. \end{aligned} \tag{5}$$

($k' = 1/k\nu_0$). Hence, in order to obtain an increased achromatic effect, it is required to locate the Fresnel lens at a position where $h^2/y$ takes a large value. To be specific, it is desired that the Fresnel lens be located at a position in the optical system, given by $$(\tfrac{1}{3})(h^2/y)_{MAX} \leq h^2/y. \tag{6}$$

Here $(h^2/y)_{MAX}$ is the maximum value of $h^2/y$.

In general, however, h = y holds at a position that satisfies Formula (6) in an actual reduction projection lens system; Formulae (5) and (6) are respectively rewritten as $$h^2/f\nu_0 \approx k'h \tag{5'}$$

$$(\tfrac{1}{3})h_{MAX} \leq h \tag{6'}$$

Thus, Formula (5') implies that the achromatic effect of the Fresnel lens is in proportion to the height of a marginal ray. Hence, in order to achieve a practically sufficient achromatic effect, the Fresnel lens must be located at a position where the marginal ray is of considerable height.

In this invention, the Fresnel lens is located at a position lying somewhere in the projection lens system, which is off its pupil, and this is preferable because the Fresnel lens can correct not only on-axial aberrations but off-axial aberrations as well, so that not only chromatic aberration but also astigmatism and coma can be corrected. In particular, Fresnel lenses, unlike ordinary refractive lenses, are equivalent in action to lenses having extremely high refractive indices, and so are greatly useful for correcting various aberrations. Another advantage of the Fresnel lenses in view of correcting various aberrations is that an aspheric surface action can be easily added thereto simply by varying their pitches.

It is noted that since the above Fresnel lenses can generally be used for correcting chromatic aberration, they would be effectively used as means for correcting chromatic aberration occurring in lens systems formed of a class of vitreous material having more or less its own limit, to say nothing of those of a single vitreous material.

Still other objects and features of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

The present invention will now be explained specifically but not exclusively with reference to the accompanying drawings, in which.

DESCRIPTION OF THE PREFERRED EMBODIMENTS

Figure 1:
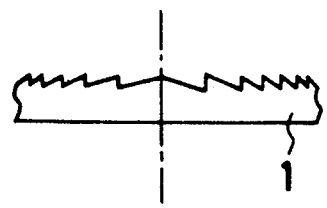
FIG. 1 is a sectional view of a Fresnel lens.
Figure 2:
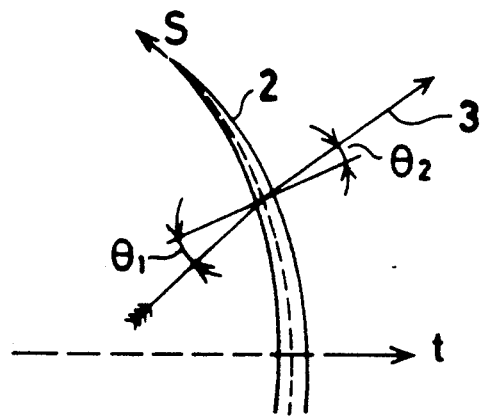
FIG. 2 is a sectional view of a refracting lens.
Figure 3:
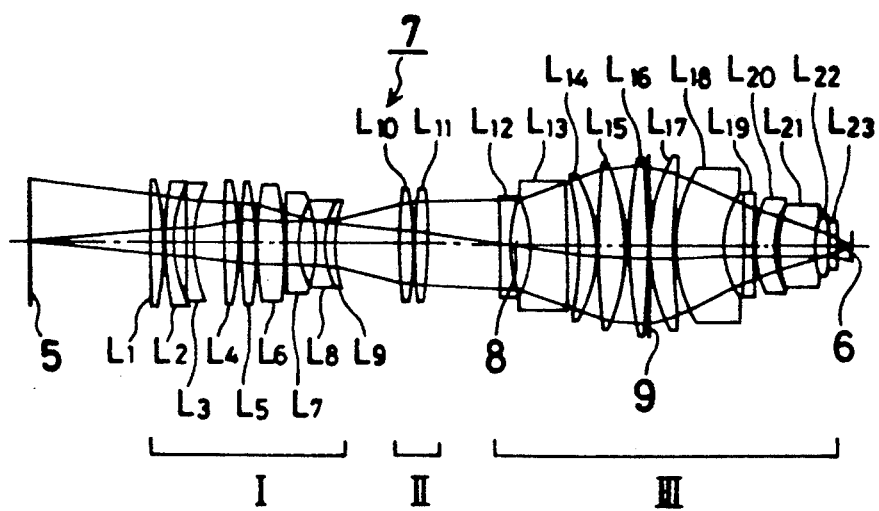
FIG. 3 is a sectional view of one example of the projection lens system to which this invention is applied.

FIG. 3 is a sectional view of one example of the projection lens system for step-and-repeat reduction photolithographic exposure systems, to which this invention is applied, including the optical axis. In FIG. 3, reference numeral 5 is the object surface, 6 the image surface, 7 the projection lens system, 8 the position of the pupil of the projection lens system, and 9 the Fresnel lens. This projection lens system comprises two sets of lens groups, each having oppositely located concave surfaces, such as $L_7$ and $L_8$ and $L_{12}$ and $L_{13}$, and a positive lens unit located between the two sets of lens groups. This lens arrangement enables the height of light to be relatively low with respect to the above concave surfaces and the negative refractive indices thereof to be increased, making correction of the Petzval's sum possible. More preferably, the ratio of the maximum, $h_{MAX}$, and minimum, $h_{MIN}$, values of the height of a marginal ray in the lens system should be given by $$h_{MIN}/h_{MAX} < \tfrac{1}{2}.$$

Moreover, this lens system is constructed by these lens units I, II and III each having negative, positive and positive refracting powers, respectively, and the pupil of this lens system is located in the lens unit III. Set out below are the numerical data of this lens system.

| NA = 0.48, Φ = 24, β = 1/5, OB = −120, SK = 12.0, EXP = 399.9, λ₂ = 248.38 nm | | |
|---|---|---|
| $r_1$ = 702.71500 | $d_1$ = 13.388428 | SiO₂ |
| $r_2$ = −412.05344 | $d_2$ = 0.1 | |
| $r_3$ = 287.93567 | $d_3$ = 10.0 | SiO₂ |
| $r_4$ = 121.27410 | $d_4$ = 9.174659 | |
| $r_5$ = 383.42582 | $d_5$ = 10.0 | SiO₂ |
| $r_6$ = 146.23108 | $d_6$ = 27.269701 | |
| $r_7$ = 287.44640 | $d_7$ = 16.320602 | SiO₂ |
| $r_8$ = −413.99164 | $d_8$ = 0.1 | |
| $r_9$ = 220.91743 | $d_9$ = 15.779223 | SiO₂ |
| $r_{10}$ = −924.03021 | $d_{10}$ = 0.1 | |
| $r_{11}$ = 169.88925 | $d_{11}$ = 31.676503 | SiO₂ |
| $r_{12}$ = −268.54719 | $d_{12}$ = 0.1 | |
| $r_{13}$ = −8604.06718 | $d_{13}$ = 10.0 | SiO₂ |
| $r_{14}$ = 65.40354 | $d_{14}$ = 18.437890 | |
| $r_{15}$ = −146.49874 | $d_{15}$ = 10.0 | SiO₂ |
| $r_{16}$ = 92.11980 | $d_{16}$ = 0.845321 | |

| -continued | | |
|---|---|---|
| NA = 0.48, Φ = 24, β = 1/5, OB = −120, SK = 12.0, EXP = 399.9, λ₂ = 248.38 nm | | |
| $r_{17}$ = 96.26337 | $d_{17}$ = 10.0 | SiO₂ |
| $r_{18}$ = 143.70540 | $d_{18}$ = 61.243443 | |
| $r_{19}$ = 247.95518 | $d_{19}$ = 16.399016 | SiO₂ |
| $r_{20}$ = 288.09993 | $d_{20}$ = 0.1 | |
| $r_{21}$ = 3429.89125 | $d_{21}$ = 9.996194 | SiO₂ |
| $r_{22}$ = −471.14586 | $d_{22}$ = 71.258955 | |
| $r_{23}$ = −1631.62530 | $d_{23}$ = 10.0 | SiO₂ |
| $r_{24}$ = 140.12340 | $d_{24}$ = 20.088173 | |
| $r_{25}$ = 90.29431 | $d_{25}$ = 36.141002 | SiO₂ |
| $r_{26}$ = −1014.00960 | $d_{26}$ = 10.514704 | |
| $r_{27}$ = −252.97273 | $d_{27}$ = 17.560280 | SiO₂ |
| $r_{28}$ = −142.68857 | $d_{28}$ = 0.1 | |
| $r_{29}$ = 1597.79878 | $d_{29}$ = 27.236473 | SiO₂ |
| $r_{30}$ = −168.48984 | $d_{30}$ = 0.1 | |
| $r_{31}$ = 319.38449 | $d_{31}$ = 20.481812 | SiO₂ |
| $r_{32}$ = −1178.90075 | $d_{32}$ = 0.1 | |
| $r_{33}$ = 5.65 × 10⁶ | $d_{33}$ = 0 (Fresnel lens (diffractive surface)) | |
| $r_{34}$ = ∞ | $d_{34}$ = 0.1 | |
| $r_{35}$ = 150.50571 | $d_{35}$ = 23.320296 | SiO₂ |
| $r_{36}$ = 508.80969 | $d_{36}$ = 0.1 | |
| $r_{37}$ = 112.91401 | $d_{37}$ = 50.0 | SiO₂ |
| $r_{38}$ = 90.23504 | $d_{38}$ = 15.038476 | |
| $r_{39}$ = 594.95644 | $d_{39}$ = 10.0 | SiO₂ |
| $r_{40}$ = 181.42134 | $d_{40}$ = 0.1 | |
| $r_{41}$ = 109.74640 | $d_{41}$ = 21.879753 | SiO₂ |
| $r_{42}$ = 68.31087 | $d_{42}$ = 3.950723 | |
| $r_{43}$ = 101.99838 | $d_{43}$ = 35.171066 | SiO₂ |
| $r_{44}$ = 67.75170 | $d_{44}$ = 0.1 | |
| $r_{45}$ = 52.25530 | $d_{45}$ = 14.318985 | SiO₂ |
| $r_{46}$ = −200.48137 | $d_{46}$ = 1.308322 | |
| $r_{47}$ = −132.18925 | $d_{47}$ = 8.0 | SiO₂ |
| $r_{48}$ = −295.06153 | | |

In the numerical data as enumerated above, $r_i$ is the radius of curvature of the i-th lens surface, $d_i$ is the space between adjacent lens surfaces, NA is the numerical aperture on the image side, Φ is the diameter of the exposure area, β is the reduction ratio, OB is the object position, SK is the image position, EXP is the pupil position and λ₂ is the design reference wavelength.

In this example, the lenses $L_1$-$L_{23}$ are all made of synthetic quartz having a refractive index of 1.50838. On the other hand, the Fresnel lens 9 is such designed as to have achromatic wavelengths $\lambda_1 = 248.38$ nm+10 pm and $\lambda_3 = 248.38$ nm−10 pm and a refractive index n=1.0001 according to the ultrahigh-index technique, and has a negative Abbe's number $\nu_2$, as found from Formula (3)

$$\nu_2 = 248.38/(248.37 - 248.39)$$
$$= -12419 < 0.$$

Figure 4:
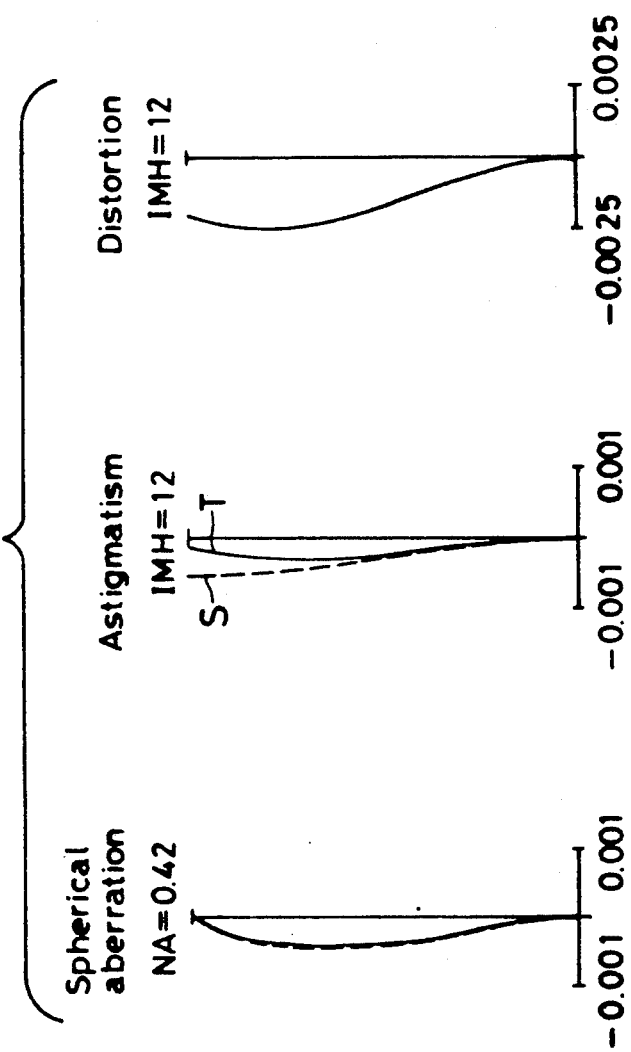
FIG. 4 is an aberration curve diagram of the example shown in FIG. 3.
Figure 5:
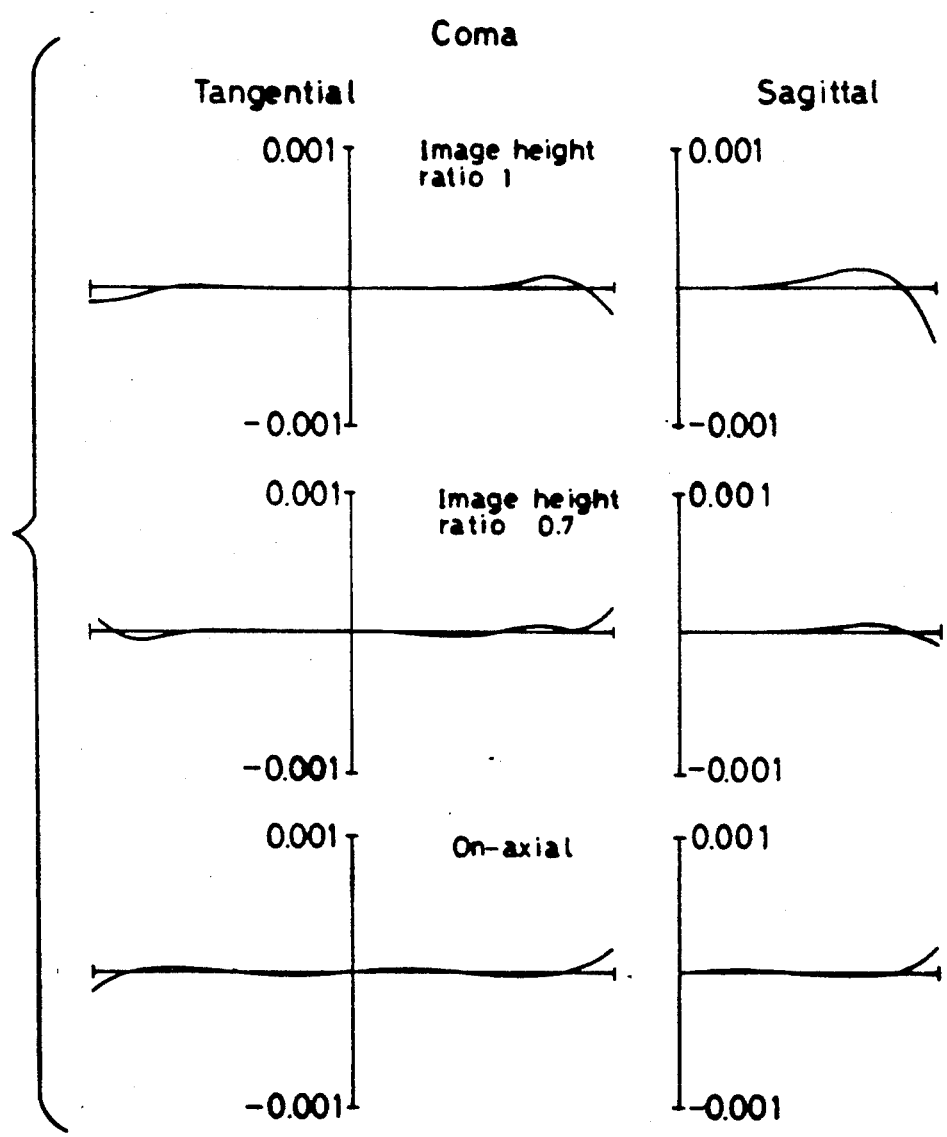
FIG. 5 is another aberration curve diagram of the example shown in FIG. 3.

The aberration curve diagrams of this lens system are shown in FIGS. 4 and 5.

Figure 6:
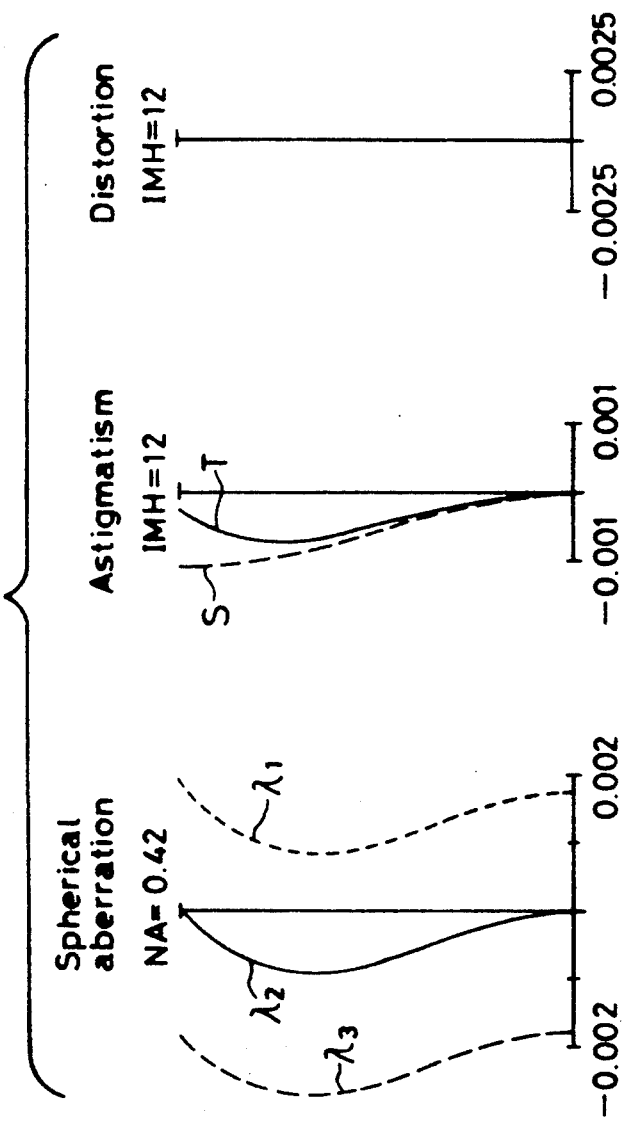
FIG. 6 is an aberration curve diagram of the lens system shown in FIG. 3, from which the Fresnel lens has been removed.
Figure 7:
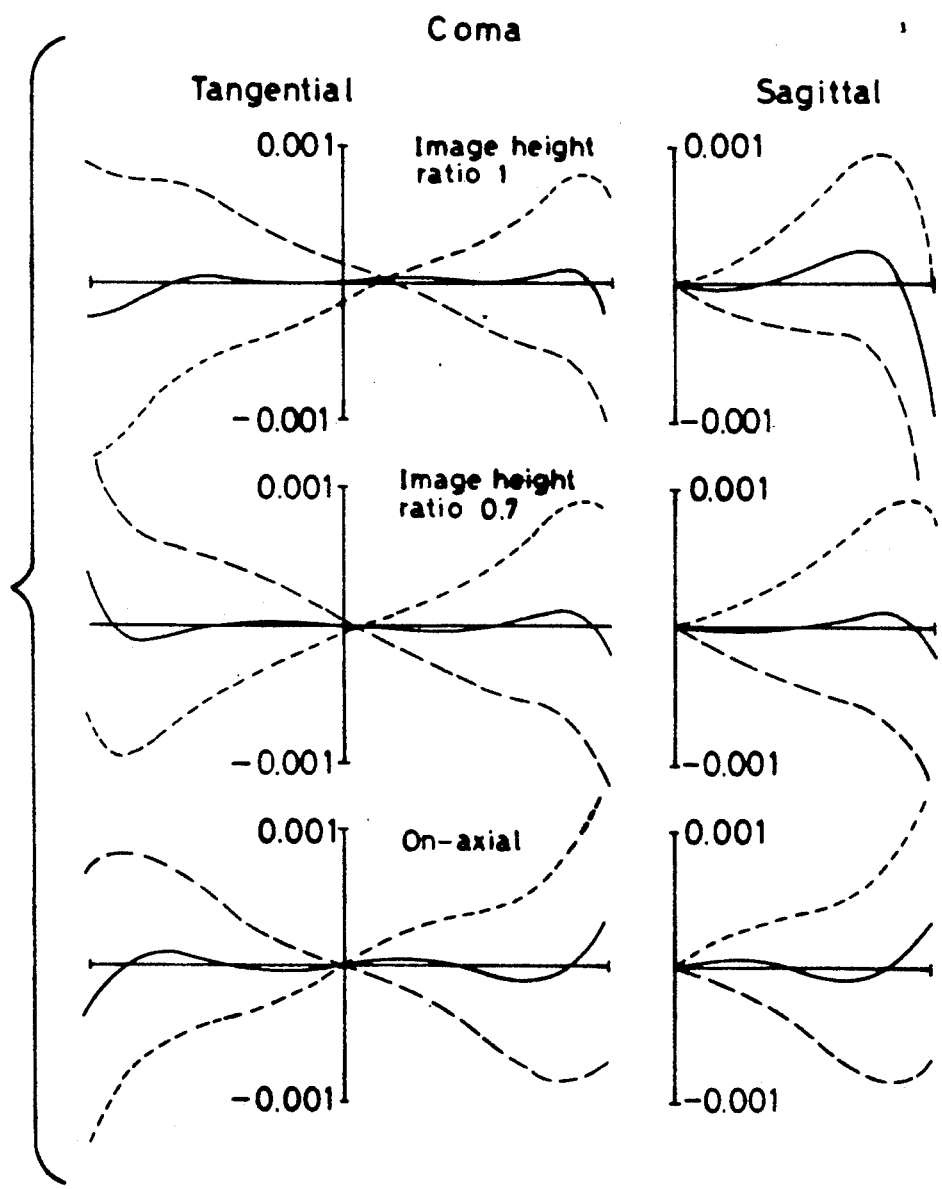
FIG. 7 is another aberration curve diagram of the lens system shown in FIG. 3, for which the Fresnel lens has been removed.

Illustrated in FIGS. 6 and 7, on the other hand, are the aberration curve diagrams of this lens system optimized after the Fresnel lens has been removed therefrom.

A comparison of FIG. 4 with FIG. 5 and FIG. 6 with FIG. 7 indicates that chromatic aberration has been well corrected by making use of the Fresnel lens. It is also indicated that not only chromatic aberration but astigmatism and coma as well have been further improved.

Figure 8:
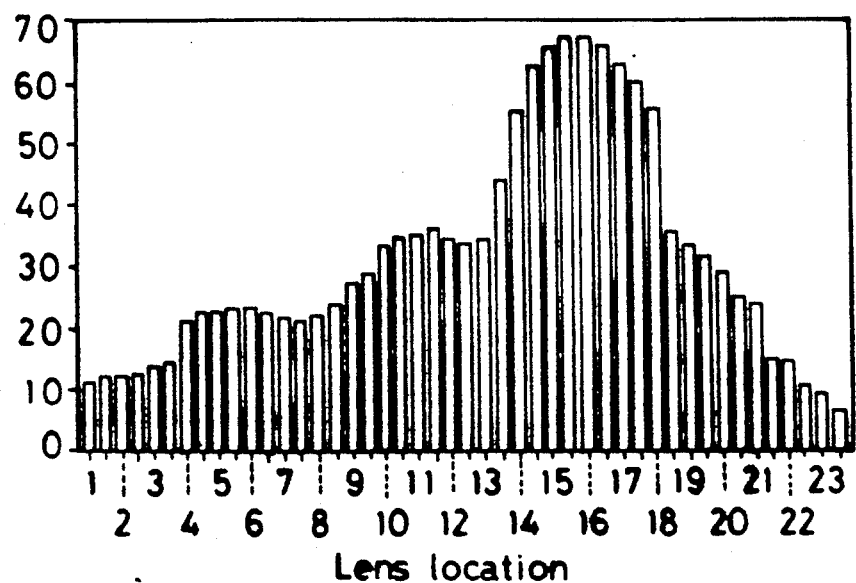
FIG. 8 is a view showing the height of a marginal ray in the lens system according to the example shown in FIG. 3.
Figure 9:
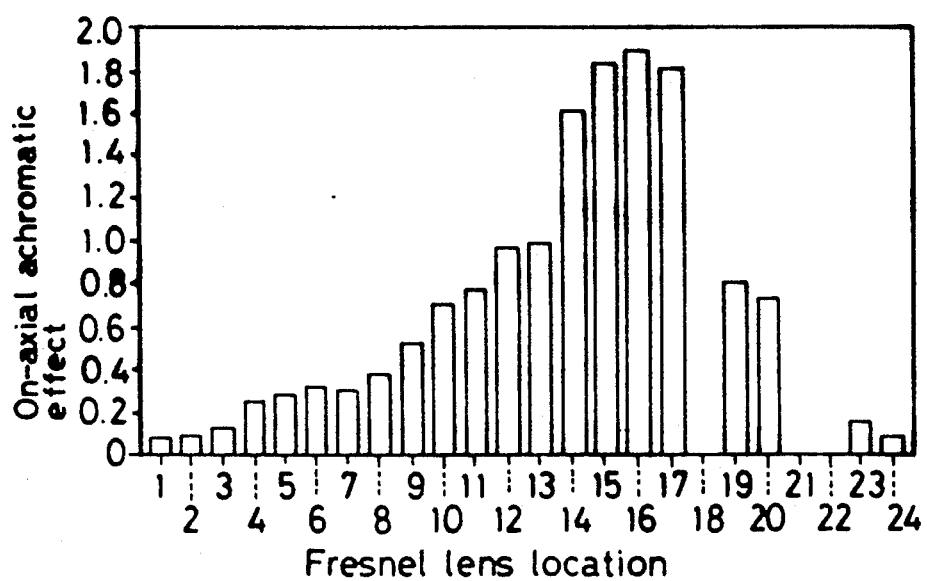
FIG. 9 is a view showing the relation between the position of the Fresnel lens and the effect on correcting chromatic aberration.

FIG. 8 shows the heights of a marginal ray on the respective lens surfaces, and FIG. 9 illustrates how the effect on correcting chromatic aberration varies with changes in the position of the Fresnel lens in the lens system. Numerals on the abscissa of FIG. 8 denote the lens numbers. For instance, "1" stands for the entrance surface and exit surface, adjacent thereto, of Lens $L_1$, "2" the entrance surface . . . of Lens $L_2$, and so on. Numerals on the abscissa of FIG. 9 represent the numbers of lens spaces in which Fresnel lenses are located. For instance, "1" stands for the space between the object and Lens $L_1$, "2" the space between Lens $L_1$ and Lens $L_2$, and so on, and those on the ordinate indicate the magnitude of $h^2/fv_2$ that is normalized by values obtained when the Fresnel lens is located at the pupil.

The on-axial achromatic effect $\Delta$ is given by the following formula:

$$\Delta \approx (Ch^2)/(yd),$$

where C is a constant, h represents the height of an axial marginal ray, y represents the effective diameter of the Fresnel lens, and d represents the minimum Fresnel pitch.

From FIG. 9, it will be seen that the higher the position of the height of a marginal ray, the better the effect on correcting chromatic aberration. Bear in mind that nothing is shown as to the spaces "18", "21" and "22", because no calculation was made concerning the effect on correcting chromatic aberration.

From FIG. 8 it will be seen that the entrance surfaces of Lens $L_{14}$ to Lens $L_{18}$ satisfy the condition concerning the height of a marginal ray, i.e., $2h_{MAX}/3 \leq h$, but from FIG. 9 it will be appreciated that within the range in which this condition holds well, the effect on correcting chromatic aberration is much increased.

Figure 10:
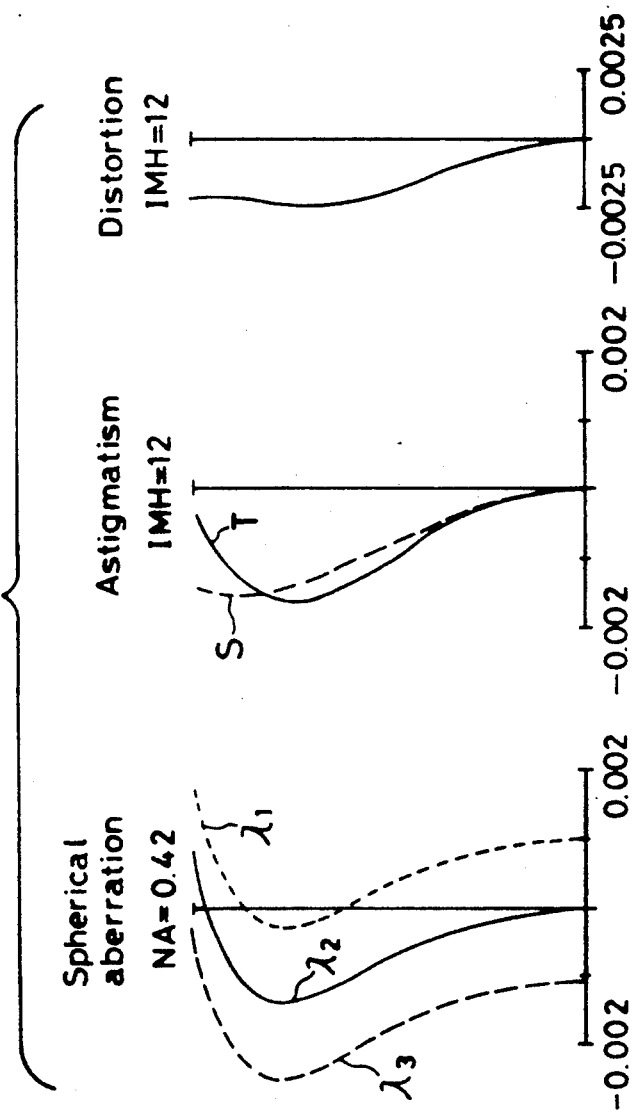
FIG. 10 is an aberration curve diagram of the lens system shown in FIG. 3, wherein the Fresnel lens is located at a position where the height of a marginal ray is relatively low.
Figure 11:
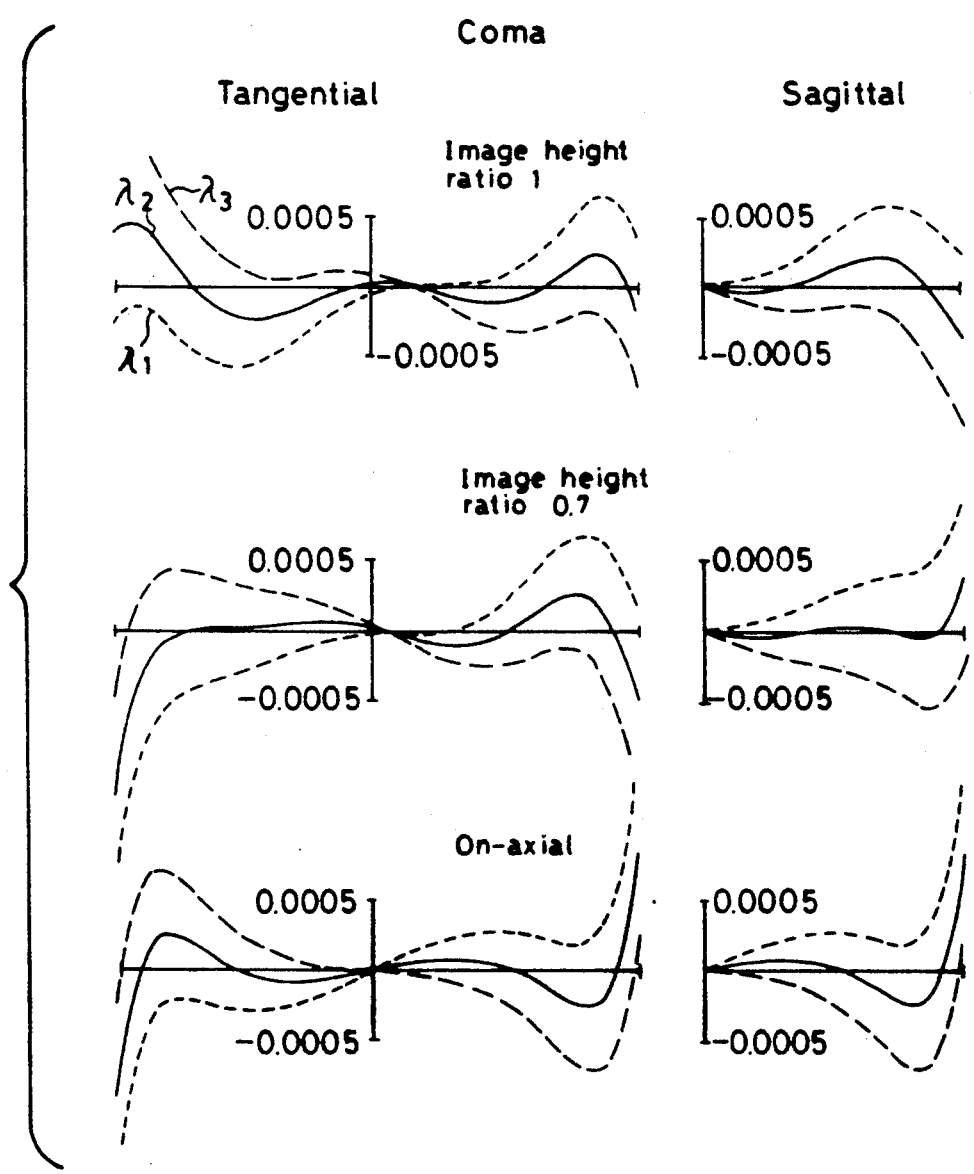
FIG. 11 is an aberration curve diagram of the lens system shown in FIG. 3, wherein the Fresnel lens is located at a position where the height of a marginal ray is relatively low.

FIGS. 10 and 11 are aberration curve diagrams of this projection lens system, which are obtained when the Fresnel lens is placed between Lenses $L_{13}$ and $L_{14}$ and nearly at a position given by $2h_{MAX}/3 \leq h$.

From a comparison of FIGS. 10.11 with FIGS. 4.5 and 6.7, it will be appreciated that the chromatic aberration of FIGS. 10 and 11 is reduced to almost ½ of that of FIGS. 6 and 7 using the Fresnel lens, but the effect on correcting aberrations shown in FIGS. 10 and 11 is smaller than that shown in FIGS. 4 and 5 using the Fresnel lens at the optimum position.

The Fresnel lens 9 used in this example is a planoconvex type of spherical Fresnel lens. However, it is noted that a Fresnel lens may be converted into either a spherical type or an aspherical type simply by varying the pitch distribution of the diffraction grating, because there is no appreciable difference between the spherical and aspherical surfaces in terms of the difficulty with which it is fabricated. For this invention, therefore, either type of Fresnel lens may be advantageously used at need. It is thus possible to correct the chromatic aberration of the projection lens system using a light source having an ultraviolet wavelength region, such as excimer laser and correct other aberrations well.

Figure 12:
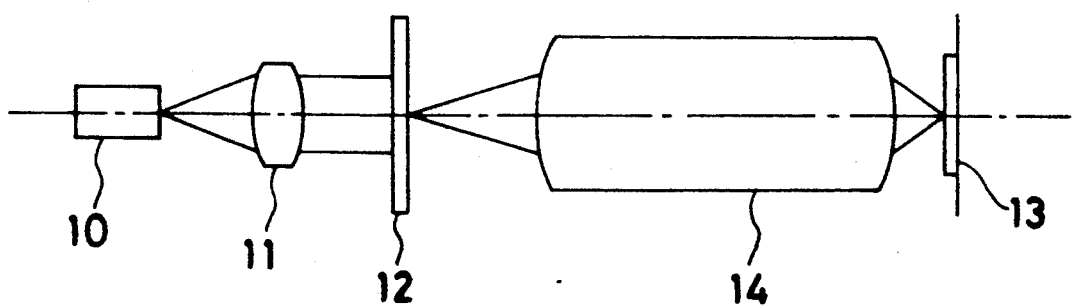
FIG. 12 is a view showing a general construction of a photographic exposure device, with which the projection lens system of this invention is used.

As shown in FIG. 12, the photographic exposure device using the projecting lens system of this invention includes a light source 10, a collimator lens 11, an object 12 illuminated by light from the light source 10, and a projection lens system 14 for projecting the image of the object 12 onto a semiconductor wafer 13.

This projecting lens system 14 is one already explained.

Note that the light source 10 used can emit light having a wavelength of 300 nm or less, and suitable to this end are excimer lasers such as KrF, ArF and $F_2$ ones.

As described above, according to this invention it is possible to obtain a projection lens system well corrected for chromatic aberration even with a single vitreous material.

What is claimed is:

1. A photographic exposure device comprising a light source, an object irradiated by light emitted from said light source, and a projection lens system for forming an image of said object on a predetermined position, wherein the wavelength of light emitted from said light source is shorter than 300 nm and said projection lens system comprising a plurality of lens elements including a Fresnel lens element having negative dispersion characteristics, said Fresnel lens element being located at a position lying somewhere in the projection lens system with the exception of the pupil thereof and satisfying the following condition:

$$2h_{MAX}/3 \leq h$$

where $h_{MAX}$ is the maximum height of a marginal ray in said projection lens system and h is the height of a marginal ray at the position of said Fresnel lens.

2. A photographic exposure device as claimed in claim 1, characterized in that said light source is an excimer laser.

3. A photographic exposure device as claimed in claim 1, characterized in that said light source is a KrF, ArF or $F_2$ excimer laser.

4. A projection lens system characterized by comprising a plurality of lens elements including a Fresnel lens element having negative dispersion characteristics, said Fresnel lens element being located at a position lying somewhere in the projection lens system with the exception of the pupil thereof and satisfying the following condition:

$$2h_{MAX}/3 \leq h$$

where $h_{MAX}$ is the maximum height of a marginal ray in said projection lens system and h is the height of a marginal ray at the position of said Fresnel lens.

5. A projection lens system as claimed in claim 4, characterized in that all the lens elements but said Fresnel lens element are made of a single vitreous material.

6. A projection lens system as claimed in claim 4, characterized by including two sets of component pairs, each having oppositely located concave surfaces, and satisfying the following condition:

$$h_{MIN}/h_{MAX} < \tfrac{1}{2}$$

where $h_{MIN}$ and $h_{MAX}$ are the minimum and maximum values of the height of a marginal ray within said projection lens system.

7. A projection lens system as claimed in claim 4, characterized by including a first lens unit of negative refracting power, a second lens unit of positive refracting power and a third lens unit of positive refracting power.

8. A projection lens system as claimed in claim 7, characterized in that said Fresnel lens element is included in said third lens unit.

9. A projection lens system as claimed in claim 7, characterized in that said third lens unit comprises a positive lens and a negative lens.

10. A projection lens system as claimed in claim 9, characterized in that a positive lens is located before or after said Fresnel lens.

11. A projection lens system as claimed in claim 7, characterized in that said pupil of the projection lens system is located in said third lens unit.

12. A projection lens system as claimed in claim 4, characterized in that all the lens elements are made of quartz.

13. A projection lens system as claimed in claim 1, characterized in that the height of the marginal ray is maximized at a position of said Fresnel lens element.

* * * * *